US008806260B2

(12) United States Patent
Cha et al.

(10) Patent No.: US 8,806,260 B2
(45) Date of Patent: Aug. 12, 2014

(54) METHOD AND APPARATUS FOR GENERATING A CLOCK SIGNAL AND FOR CONTROLLING A CLOCK FREQUENCY USING THE SAME

(75) Inventors: Chi-ho Cha, Hwaseong-si (KR); Hoon-sang Jin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 484 days.

(21) Appl. No.: 13/153,718

(22) Filed: Jun. 6, 2011

(65) Prior Publication Data

US 2011/0239035 A1 Sep. 29, 2011

Related U.S. Application Data

(62) Division of application No. 11/853,087, filed on Sep. 11, 2007, now abandoned.

(30) Foreign Application Priority Data

Sep. 12, 2006 (KR) .................. 10-2006-0088186

(51) Int. Cl.
*G06F 1/00* (2006.01)
*G06F 1/12* (2006.01)
*G06F 1/04* (2006.01)
*H03K 3/00* (2006.01)

(52) U.S. Cl.
USPC ............ 713/500; 713/400; 713/600; 327/291

(58) Field of Classification Search
None
See application file for complete search history.

(56) References Cited

U.S. PATENT DOCUMENTS

| 6,157,376 | A | 12/2000 | Eglit |
| 6,208,180 | B1 | 3/2001 | Fisch et al. |
| 6,289,067 | B1 | 9/2001 | Nguyen et al. |
| 6,363,490 | B1 * | 3/2002 | Senyk ............................ 713/300 |
| 6,604,200 | B2 * | 8/2003 | Zack et al. ...................... 713/320 |
| 6,629,256 | B1 * | 9/2003 | Ilan et al. ....................... 713/501 |
| 7,206,958 | B1 | 4/2007 | Sutherland et al. |
| 7,624,294 | B2 | 11/2009 | Conway |
| 2002/0087897 | A1 * | 7/2002 | Cline et al. ..................... 713/300 |
| 2004/0158760 | A1 | 8/2004 | Farmer et al. |
| 2005/0028018 | A1 | 2/2005 | Shikata |
| 2010/0005323 | A1 * | 1/2010 | Kuroda et al. ................. 713/300 |

FOREIGN PATENT DOCUMENTS

| JP | 1990089476 | 3/1990 |
| JP | 1990278318 | 11/1990 |
| JP | 09-046222 | 2/1997 |
| JP | 2001-209454 | 8/2001 |
| JP | 2001213002 | 8/2001 |
| JP | 2002026723 | 1/2002 |
| JP | 2002-158567 | 5/2002 |
| JP | 2003330569 | 11/2003 |
| JP | 2004153757 | 5/2004 |
| JP | 2005122374 | 5/2005 |
| KR | 1020020020551 A | 3/2002 |
| KR | 1020000065911 A | 11/2002 |

* cited by examiner

*Primary Examiner* — Ji H Bae
(74) *Attorney, Agent, or Firm* — Volentine & Whitt, PLLC

(57) ABSTRACT

A method and a device for generating a clock signal determine a number of pulses to be discarded from each predetermined cycle of a reference clock signal in order to obtain, on average, a target frequency. A masking pattern is created for discarding the number of pulses to be discarded from each predetermined cycle of the reference clock signal. The clock signal, which includes the target frequency, is generated by discarding the number of pulses from the reference clock signal using the masking pattern.

8 Claims, 10 Drawing Sheets

| OUTPUT OF DECIMAL COUNTER | 0 | 1 | 2 | 3 | 4 | 5 | 6 | 7 | 8 | 9 |
|---|---|---|---|---|---|---|---|---|---|---|
| MAPPED OUTPUT | 0 | 1 | 1 | 1 | 1 | 1 | 1 | 1 | 0 | 0 |

METHOD AND APPARATUS FOR GENERATING A CLOCK SIGNAL AND FOR CONTROLLING A CLOCK FREQUENCY USING THE SAME

CROSS-REFERENCE TO RELATED PATENT APPLICATIONS

This application is a divisional application of application Ser. No. 11/853,087 filed on Sep. 11, 2007, which claims priority to Korean Patent Application No. 10-2006-0088186, filed Sep. 12, 2006, the subject mater of which is hereby incorporated by reference.

BACKGROUND OF THE INVENTION

1. Field of the Invention

The present invention relates to a method and apparatus for generating a clock signal, and more particularly, to a method and apparatus for generating a clock signal from a reference clock signal.

2. Description of the Related Art

In general, clock signal generators are used in the field of electronic devices, including semiconductors. More particularly, clock signal generators may be used in designing an electronic circuit, which requires a clock signal having a particular frequency to process data. If necessary, the clock signal generator executes frequency division of reference clock signal to generate clock signals having a variety of different frequencies.

Korean Laid-open Patent No. 2000-0065911 discloses preventing glitches produced while generating clock signals, regardless of delay elements, and Japanese Laid-open Patent No. 2001-209454 discloses generating clock signals, which are not integral numbers, using a circuit that generates a polyphase clock.

According to the conventional art, a reference clock signal may be divided by an integer to generate clock signals having a target frequency. For example, a reference clock signal having a frequency of 100 MHz may be divided by integers to generate clock signals having frequencies of 50 MHz, 25 MHz, 12.5 MHz, and so on. However, when a clock signal having a target frequency of 75 MHz is required, a new reference clock signal is necessary. For example, a new reference clock signal having a frequency of 300 MHz, which is the least common multiple of 100 MHz and 75 MHz, is required.

Accordingly, the conventional technology which divides a reference clock signal by an integer to generate clock signals produces limited frequencies of clock signals, and therefore, in practice, a variety of reference clock sources are needed.

It may be possible to generate clock signals having a variety of different frequencies using a phase locked loop (PLL) circuit, but when a PLL circuit is used, a phase locking time can result in operational delays.

Moreover, clock signals having different frequencies generated from a source clock signal are not synchronized with one another. Thus, an additional synchronizer is required for processing data, which decreases processing speed.

SUMMARY OF THE INVENTION

An aspect of the present invention provides a method of generating a clock signal, which includes determining a number of pulses to be discarded from each predetermined cycle of a reference clock signal in order to obtain, on average, a target frequency and creating a masking pattern for discarding the number of pulses to be discarded from each predetermined cycle of the reference clock signal. The method further includes generating the clock signal, having the target frequency, by discarding the number of pulses from the reference clock signal using the masking pattern. Determining the number of pulses to be discarded may include obtaining a greatest common divisor (G.C.D.) of a frequency of the reference clock signal and the target frequency; dividing each of the reference clock signal frequency and the target frequency by the G.C.D.; and determining a length of the predetermined cycle to include pulses of the reference clock signal. A number of the pulses is the same as a value obtained by dividing the reference clock signal frequency by the G.C.D. The number of pulses to be discarded is a difference between the value obtained by dividing the reference clock signal frequency by the G.C.D. and a value obtained by dividing the target frequency by the G.C.D. The masking pattern is used to change a location of at least one clock pulse to be discarded from each predetermined cycle according to an initial set.

Another aspect of the present invention provides a method of generating a target clock signal. The method includes calculating a pulse detecting location in a cycle, which includes a number of pulses corresponding to an inverse of a frequency of the target clock signal. A pulse of a reference clock signal is detected, the detected pulse having a predetermined relationship with the calculated pulse detecting location. The target clock signal is generated using the detected pulse of the reference clock signal. The detected pulse of the reference clock signal may be a closest pulse to the calculated pulse detecting location, a pulse generated immediately before or after the calculated pulse detecting location, or a pulse generated an initially set number of pulses after the calculated pulse detecting location. Also, a duty ratio of the generated target clock signal may be changed to comply with an initially set standard.

Another aspect of the present invention provides a method of generating a target clock signal. The method includes receiving an externally provided clock signal for detecting a pulse, the clock signal having a target frequency; detecting a pulse of a reference clock signal in relation to a pulse occurrence location of the clock signal for detecting a pulse; and generating the target clock signal using the detected pulse of the reference clock signal.

Another aspect of the present invention provides a method of controlling a clock frequency. The method includes generating a clock signal for an application having, on average, a target frequency from a reference clock signal, and calculating a data processing progress percentage of processing data using the clock signal. A difference is determined between the calculated data processing progress percentage and a target progress percentage. The target frequency of the clock signal is then changed based on the determined difference. Changing the target frequency of the clock signal may include decreasing the target frequency of the clock signal when the calculated progress percentage is greater than the target progress percentage by a first predetermined amount, and increasing the target frequency of the clock signal when the calculated progress percentage is less than the target progress percentage by a second predetermined amount.

Generating the clock signal for the application may include discarding a calculated number of pulses from each section of the reference clock signal, so that the reference clock signal includes, on average, the target frequency. Also, generating the clock signal may include calculating a pulse detecting location in multiple cycles of the reference clock signal, where the number of pulses of each cycle corresponds to an inverse of the target frequency, and detecting a pulse of the reference clock signal closest to the calculated pulse detecting location.

Another aspect of the present invention provides a device for generating a clock signal for an application, including a reference clock generator, a masking pattern generator and an AND gate. The reference clock generator generates a reference clock signal having multiple clock pulses. The masking pattern generator creates a masking pattern to discard at least one clock pulse of the clock pulses from the reference clock signal in order to generate a target frequency from the reference clock signal. The AND gate generates the clock signal for the application by logically multiplying the reference clock signal and the masking pattern. The masking pattern generator may include a counter for counting a number of pulses of the reference clock signal, and a mapping unit for outputting signals having logic values mapped to either 0 or 1, based on a ratio of the frequency of the reference clock signal to the target frequency. The counter may count in units of N, where N is a value obtained by dividing the frequency of the reference clock signal by a greatest common divisor (G.C.D.) of the frequency of the reference clock signal and the target frequency.

Another aspect of the present invention provides a device for generating a clock signal for an application. The device includes a reference clock generator, a microprocessor and a pulse detector. The reference clock generator generates a reference clock signal. The microprocessor calculates a pulse detecting location in multiple cycles, each cycle including a number of pulses corresponding to an inverse of a target frequency of a clock signal for an application. The pulse detector generates the clock signal by detecting a pulse of the reference clock signal having a predetermined relationship with the pulse detecting location. For example, the pulse detector may detect the pulse of the reference clock signal closest to the calculated pulse detecting location, the pulse generated immediately before or after the calculated pulse detecting location, or the pulse generated an initially set number of pulses after the calculated pulse detecting location. The device may also include a duty alteration circuit configured to change a duty of the clock signal output from the pulse detector to comply with an initially set standard.

Yet another aspect of the present invention provides a device for controlling a clock frequency, including a clock signal generating circuit, an application circuit and a microprocessor. The clock signal generating circuit is configured to generate a clock signal for an application, where the clock signal has a target frequency from a reference clock signal. The application circuit is configured to process data using the clock signal for the application. The microprocessor is configured to calculate a data processing progress percentage of the application circuit and to control the clock signal generating circuit to change the target frequency based on a difference between the calculated data processing progress percentage and a target progress percentage. The microprocessor may be further configured to control the clock signal generating circuit to decrease a frequency of the clock signal when the calculated progress percentage is greater than the target progress percentage by a first predetermined amount, and to increase the frequency of the clock signal when the calculated progress percentage is less than the target progress percentage by a second predetermined amount.

The clock signal generating circuit may include a masking pattern generator for creating a masking pattern to discard at least one pulse from the reference clock signal to obtain the target frequency from the reference clock signal, and an AND gate for generating the clock signal for the application by logically multiplying the reference clock signal and the masking pattern. Also, the clock signal generating circuit may include an arithmetic circuit for calculating a pulse detecting location in multiple cycles, each cycle having a number of pulses corresponding to an inverse of the target frequency of the clock signal for the application, and a pulse detector for detecting a pulse of the reference clock signal generated closest to the pulse detecting location.

BRIEF DESCRIPTION OF THE DRAWINGS

The embodiments of the present invention will be described with reference to the attached drawings, in which.

DETAILED DESCRIPTION OF EMBODIMENTS

Figure 1:
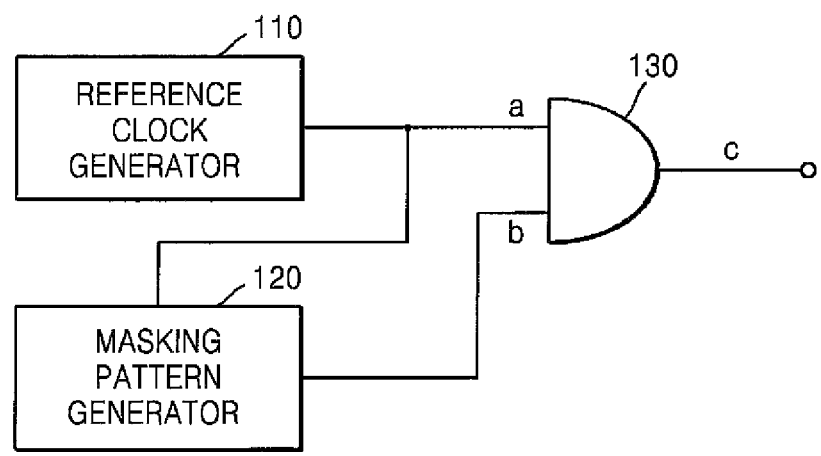
FIG. 1 is a configuration diagram of a masking pattern generating device for generating a clock signal, according to an embodiment of the present invention.

The accompanying drawings are referred to in order to facilitate descriptions of various embodiments of the present invention, the merits thereof, and the objectives accomplished by the implementation of the present invention.

Hereinafter, the present invention will be described in detail by explaining various embodiments with reference to the attached drawings. Like reference numerals in the drawings denote like elements.

The present invention includes the following two methods to generate a clock signal.

A first method is to generate a target clock signal having a target frequency by discarding some clock pulses of a reference clock signal. In other words, some of the clock pulses are removed to adjust a frequency to the target frequency. In this manner, pulse intervals are not uniform, although average frequencies may generally be adjusted to the target frequency.

For example, a reference clock signal of 100 MHz may be adjusted to a target clock signal of 70 MHz. The pulses of the reference clock signal are divided into groups of ten, and three pulses are deleted from each group of ten. The target clock signal of 70 MHz may then be obtained.

A second method is to generate a target clock signal by calculating a pulse detecting position corresponding to a target frequency, and detecting a clock pulse of a reference clock signal having a predetermined relationship, e.g., the closest pulse, with the calculated position.

Accordingly, in both methods, edge positions of the target clock signals are the same as edge positions of the reference clock signals.

Exemplary embodiments of the clock signal generating methods according to the present invention will be described below.

With respect to the first method, FIG. 1 is a configuration diagram of a device for generating a clock signal according to an embodiment of the present invention. Referring to FIG. 1, the device includes a reference clock generator 110, a masking pattern generator 120, and an AND gate 130.

The reference clock generator 110 generates a reference clock signal, which is a source clock signal used by an electronic device. The reference clock signal may be generated using, for example, an oscillating element, such as a crystal or ceramic oscillator. The electronic device derives desired or target clock signals, required by various applications, using the reference clock signal. Therefore, the frequency of the reference clock signal is set higher than the frequency of the derived clock signals.

Figure 2:
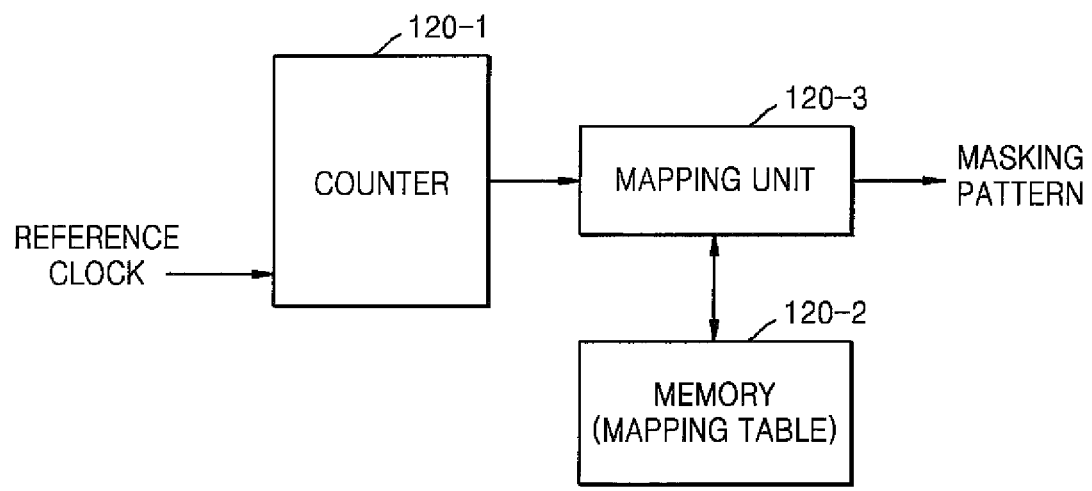
FIG. 2 is a circuitry structure of the masking pattern generator illustrated in FIG. 1, according to an embodiment of the present invention.

The masking pattern generator 120 creates a master pattern for discarding some clock pulses of the reference clock signal in order to generate a target frequency from the reference clock signal. FIG. 2 illustrates an exemplary circuit structure of the masking pattern generator 120, in detail.

Referring to FIG. 2, the masking pattern generator 120 includes a counter 120-1, a memory 120-2 for storing a mapping table, and a mapping unit 120-3. The counter 120-1 counts in units of N (where N is an integer). N may be determined based on the frequency of the reference clock signal and a target frequency of a desired clock signal. In other words, N may be determined by dividing the frequency of the reference clock signal by the greatest common divisor (G.C.D.) of the frequency of the reference clock signal and the target frequency.

For example, when the frequency of the reference clock signal is 100 MHz and the target frequency of a clock signal to be derived is 70 MHz, the G.C.D. of the frequencies is 10,000,000. As such, a value obtained by dividing the frequency of the reference clock signal by the G.C.D. is 10. Thus, in this case, the counter 120-1 is set to a decimal counter.

The memory 120-2 stores a mapping table which maps output values of the counter 120-1 to 0 or 1. A mapping method according to the present embodiment is to map 1 and 0 according to the proportion of a frequency of the reference clock signal to a target frequency of a derived clock signal.

Figures 3, 4:
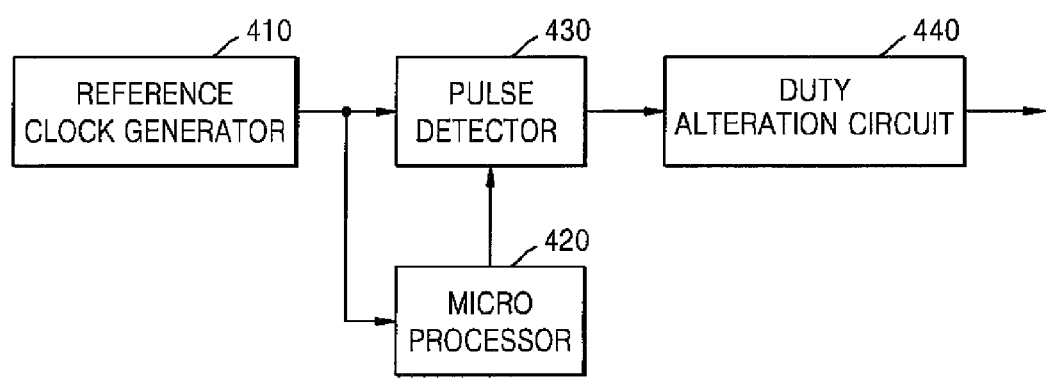
FIG. 3 is an example of a mapping table adapted to an embodiment of the present invention.
FIG. 4 is a configuration diagram of a device for generating a clock signal, according to an embodiment of the present invention.

For instance, when a frequency of the reference clock signal is 100 MHz and a target frequency of the derived clock signal is 70 MHz, the ratio of the numbers of 1 to 0 in the mapping table is 7:3. Specifically, in the mapping table, seven out of ten values from 0 to 9 of the decimal counter are mapped to 1, and the other three values are mapped to 0. FIG. 3 shows an example of the mapping table depicting this case. In FIG. 3, the counter values 0, 8, and 9 are mapped to 0, and the remaining counter values are mapped to 1.

According to the present embodiment, the number of the counter values which will be mapped to 0 or 1 is significant for the mapping table. However, the specific counter output values which will be mapped to 0 or 1 can be variously set. For example, the average frequency of the clock signal generated when the counter values of 0, 8, and 9 are mapped to 0 and the remaining counter values are mapped to 1 is the same as the average frequency of the clock signal generated when the counter values of 1, 3, and 5 are mapped to 0 and the remaining counter values are mapped to 1.

The mapping unit 120-3 of FIG. 2 uses the mapping table stored in the memory 120-2 to create a masking pattern corresponding to a logic value of 0 or 1, which is mapped to values output from the counter 120-1.

Referring again to FIG. 1, the reference clock signal (a) generated by the reference clock generator 110 and the masking pattern (b) created by the masking pattern generator 120 are input to the AND gate 130. The AND gate 130 then outputs a signal corresponding to an output of an AND operation of the reference clock signal (a) and the masking pattern (b). For example, the AND gate 130 logically multiplies the reference clock signal (a) and the masking pattern (b). The signal output from the AND gate 130 becomes the target clock signal (c), which has a frequency desired to be generated from the reference clock signal.

Figure 10:
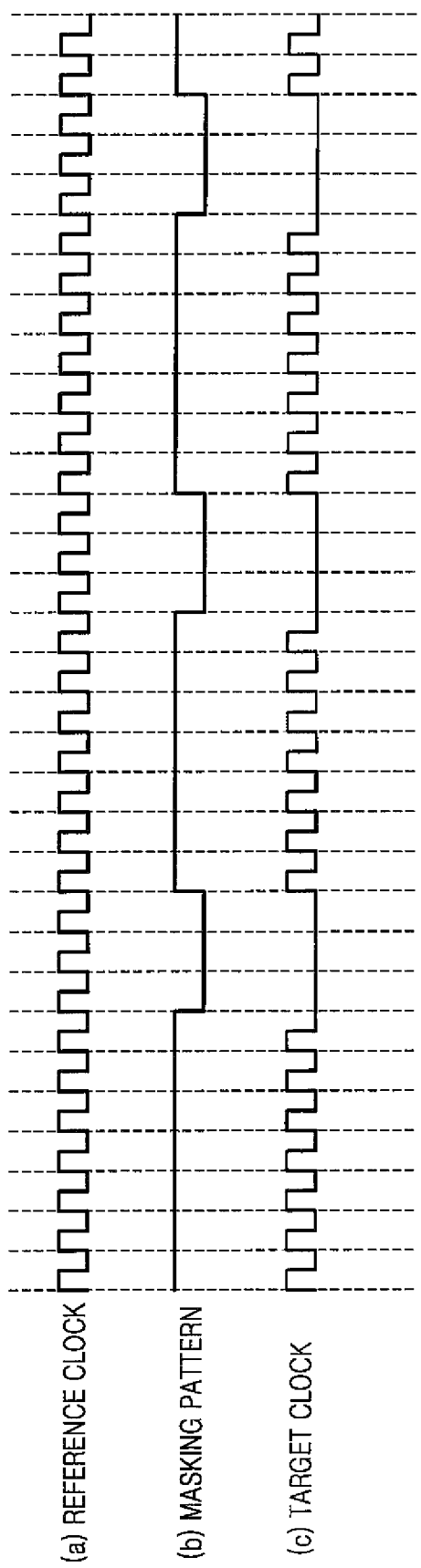
FIG. 10 is a timing diagram of significant signals used for the device, according to an embodiment of the present invention.

Referring to the example shown in FIG. 10, when a frequency of a reference clock signal (a) is 100 MHz and a target frequency of a target clock signal (c) to be derived from the reference clock signal (a) is 70 MHz, a masking pattern (b) is generated using the mapping table illustrated in FIG. 3. Thus, the target clock signal (c) has an average frequency of 70 MHz.

According to the present embodiment, pulse intervals of the target clock signal (c) are not uniform. Rather, when pulses of the reference clock signal (a) are divided into groups of ten, for example, and three pulses of each group of ten are deleted, the target average frequency of 70 MHz can be obtained. Further, a pulse edge of the target clock signal (c) is exactly matched to a pulse edge of the reference clock signal (a), and thus an additional synchronizer is not necessary.

Figure 6:
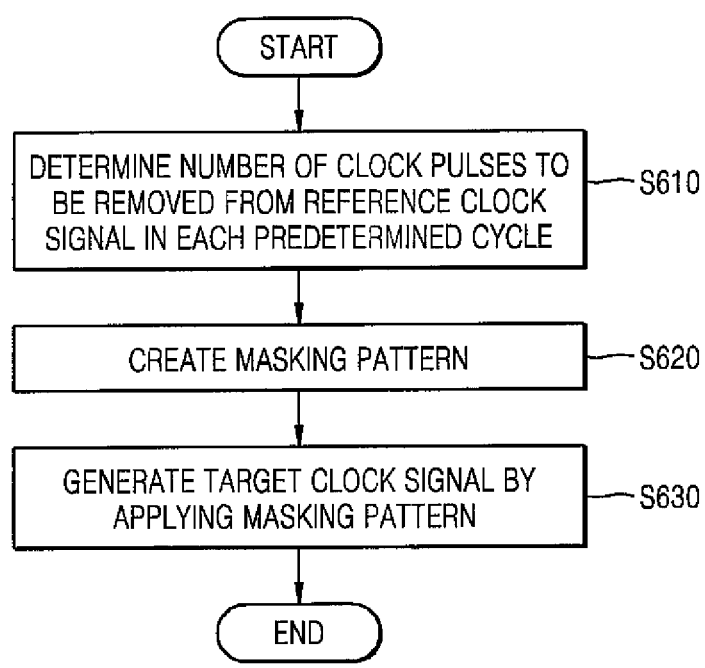
FIG. 6 is a flowchart depicting a method of generating a clock signal, according to an embodiment of the present invention.

FIG. 6 is a flowchart illustrating a method of generating a clock signal according to an embodiment of the present invention. Referring to FIG. 6, the number of pulses to be deleted from pulses of a reference clock signal in each cycle is determined based on a frequency of a target clock signal, which is to be derived from the reference clock signal that is a source clock signal (S610).

To determine the cycles and the number of the clock pulses deleted from the reference clock signal for each cycle, the greatest common devisor (G.C.D.) of the frequency of the reference clock signal and the frequency of the target clock signal is calculated. Then, the frequencies of the reference clock signal and of the target clock signal are each divided by the G.C.D. A length of each cycle is determined by section length, which includes reference clock pulses having the same number as the value obtained by dividing the reference clock signal by the G.C.D. Then, the number of pulses to be deleted from every cycle is determined by subtracting the value obtained by dividing the frequency of the target clock signal by the G.C.D. from the value obtained by dividing the frequency of the reference clock signal by the G.C.D.

For example, when the frequency of the reference clock signal is 100 MHz and the target frequency of the target clock signal to be derived is 70 MHz, the G.C.D. is 10,000,000 (i.e., the largest integer by which both frequencies may be divided, with no remainder). Then, the value of dividing the frequency of the reference clock signal by the G.C.D. is 10, and the value of dividing the frequency of the target clock signal by the G.C.D. is 7. Therefore, in this case, the length of the predetermined cycle is to include 10 reference clock pulses, and the number of pulses to be removed from each of the cycles is 3.

Next, a masking pattern is created based on the cycles and the number of the reference clock signals determined in operation S610 (S620). For example, it is assumed that the predetermined cycle has the length which includes 10 clock pluses and the number of clock pulses to be removed from the cycle is 3. The masking pattern is created to maintain three pulses out of the ten reference clock pulses at a low level, and to maintain the remaining seven pulses at a high level, as illustrated in FIG. 10.

Then, the masking pattern created in operation S620 is adapted to generate a target clock signal by discarding some clock pulses of the reference clock signal (S630). For example, in accordance with the masking pattern illustrated in FIG. 10, the reference clock pulses included in sections of the masking pattern which maintain the pluses at a low level are removed, and the reference clock pulses included in sections of the masking pattern which maintain the pulses at a high level are output intact. Accordingly, the clock pulse intervals of the target clock signal are not uniform, but the average frequency matches that of the target clock signal.

If the masking pattern is designed to change which pulses will be removed from a predetermined cycle according to initially set rules, electromagnetic wave energy can be dispersed over various frequency bands, and thereby improving electromagnetic interference (EMI).

With respect to the second method, FIG. 4 is a block diagram of a device for generating a clock signal according to another embodiment of the present invention. Referring to FIG. 4, the device includes a reference clock generator 410, a microprocessor 420, a pulse detector 430, and a duty alteration circuit 440.

The reference clock generator 410 generates a reference clock signal which is a source clock signal used by an electronic system using, for example, an oscillating element, such as a crystal or ceramic oscillator. The system derives desired clock signals required for various applications using the reference clock signal. Therefore, a frequency of the reference clock signal is designed to be higher than a frequency of a target clock signal.

Figure 11:
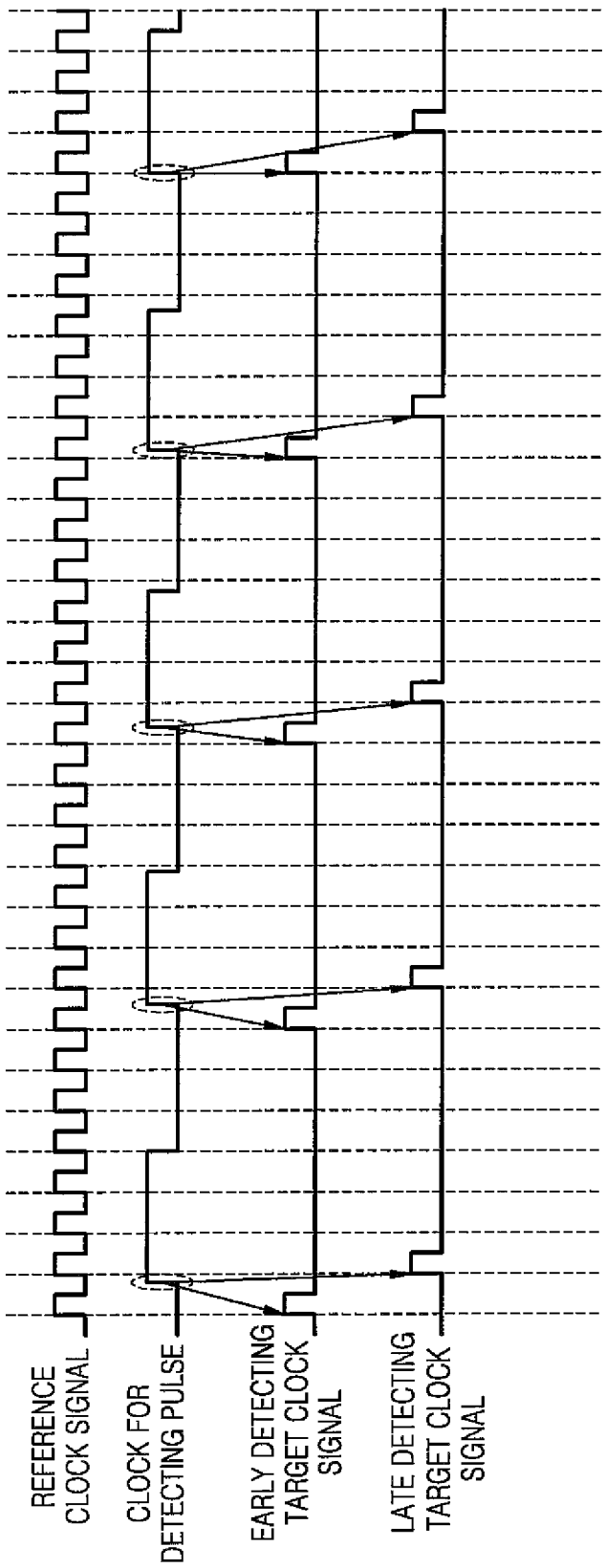
FIG. 11 is a timing diagram of significant signals used for the device, according to another embodiment of the present invention.

The microprocessor 420 calculates a pulse detecting position in cycles, each cycle having a number of pulses corresponding to the inverse of a target frequency of a clock signal for an application. In other words, a cycle starting position of the clock signal for an application is subsequently calculated based on the reference clock signal. Here, the cycle starting position of the clock signal for an application corresponds to the pulse detecting position. FIG. 11 shows a clock signal for detecting pulses, which is the clock signal that has clock cycles of which a starting position is the calculated pulse detecting position. However, when a target frequency of the clock signal for an application is not a divisor of the frequency of the reference clock signal, the result is a fraction or decimal. If the calculated pulse detecting position is a value having digits below the decimal point, it means that the pulse detecting position is not the same as a pulse edge position of the reference clock signal.

The pulse detector 430 generates the clock signal for an application by detecting the pulse of the reference clock signal which has a specified or predetermined relationship with the calculated pulse detecting position, for example, the pulse produced closest to the calculated pulse detecting position. The pulse detector 430 can detect a reference clock at a point where the pulse detecting position matches a pulse edge of the reference clock signal, but otherwise should detect a pulse of the reference clock signal which has a specified relationship to the pulse detecting position.

The specified relationship may be determined according to particular rules, examples of which are as follows. First, the detected pulse of the reference clock signal may be a pulse that is generated closest to the calculated pulse detecting position. In this case, the pulse of the reference clock signal is detected by rounding off decimals. Second, the detected pulse of the reference clock signal may be a pulse that is generated immediately before the calculated pulse detecting position. When the pulse of the reference clock signal is detected in this way, an early detecting clock signal for an application is obtained, as illustrated, for example, in FIG. 11. Third, the detected pulse of the reference clock signal may be a pulse that is generated immediately after the calculated pulse detecting position. According to this rule, a late detecting clock signal for an application is obtained, as illustrated, for example, in FIG. 11. Fourth, the detected pulse of the reference clock signal may be a pulse that is generated after predetermined number of cycles from the calculated pulse detecting position.

Figure 12:
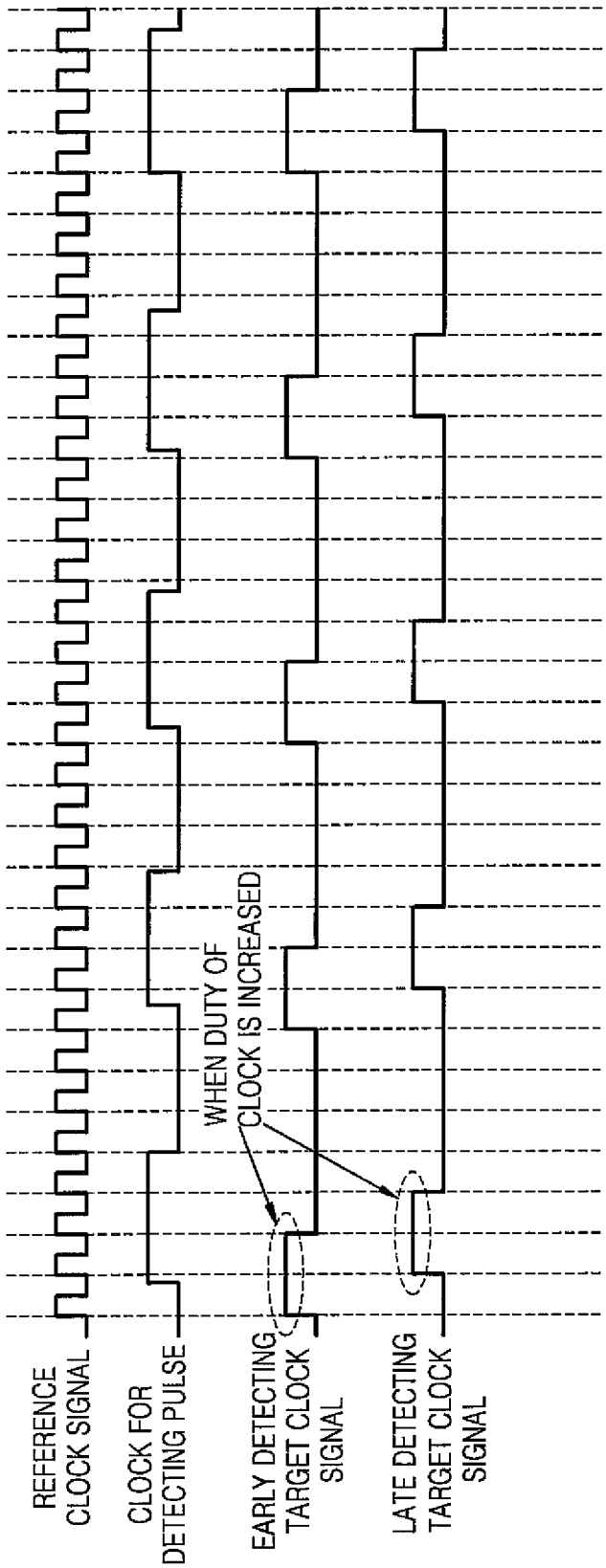
FIG. 12 is a timing diagram of significant signals used for the device, according to another embodiment of the present invention.

Applying these exemplary rules, a pulse edge of the clock signal for an application which is output from the pulse detector 430 exactly matches a pulse edge of the reference clock signal, and its pulse intervals are uniform. However, as illustrated in FIG. 11, a duty ratio of the target clock signal is reduced. To compensate for the reduction of the duty ratio, the duty ratio alteration circuit 440 of FIG. 4 increases the duty ratio, as illustrated in FIG. 12. For example, in the target clock signal, when the length of a span of pulses at a logic "high" level is increased to the length of two cycles of the reference clock signal, the duty of the target clock signal increases, as illustrated in FIG. 12.

In an embodiment, the duty alteration circuit 440 is optional. The duty alteration circuit 440 may thus be omitted when an application which processes data using the target clock signal can operate stably with a target clock signal having a low duty ratio.

Figure 7:
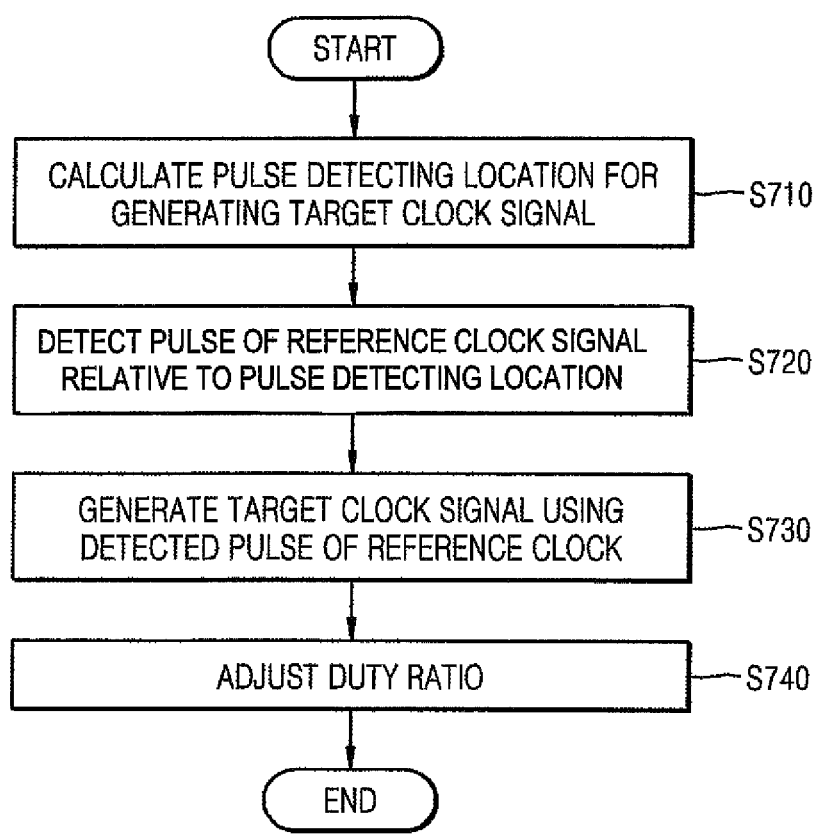
FIG. 7 is a flowchart depicting a method of generating a clock signal according to another embodiment of the present invention.

FIG. 7 is a flowchart illustrating a method of generating a clock signal according to another embodiment of the present invention. Referring to FIG. 7, a pulse detecting position of a reference clock signal is detected in cycles, each cycle having a number of pulses corresponding to the inverse of a target frequency of a reference clock signal (S710). In other words, a cycle starting position is constantly detected based on the reference clock signal. Here, the cycle starting position corresponds to the pulse detecting position.

Next, a pulse of the reference clock signal which is generated relative to the calculated pulse detecting position is detected (S720). As discussed above, there are several methods to detect the pulse of the reference clock signal, such as, detecting the pulse generated closest to the calculated pulse detecting position, detecting the pulse generated immediately before the calculated pulse detecting position, detecting the pulse generated immediately after the calculated pulse detecting position, or detecting the pulse generated after a predetermined number of cycles from the calculated pulse detecting position.

The target clock signal is generated using the pulse of the reference clock signal which has been detected in operation S720 (S730). Accordingly, the target clock signal is produced by discarding some pulses of the reference clock signal.

Then, a duty ratio of the target clock signal produced in operation S730 may be adjusted (S740). For example, the duty ratio can be increased by extending the length of a span of pulses at a logic "high" level in the target clock signal to the length of the reference clock signal's cycle, which has been initially set. In an embodiment, operation S740 is optional. For example, it may be omitted when an application which processes data using the target clock signal can operate stably with a target clock signal having a low duty ratio.

Figure 8:
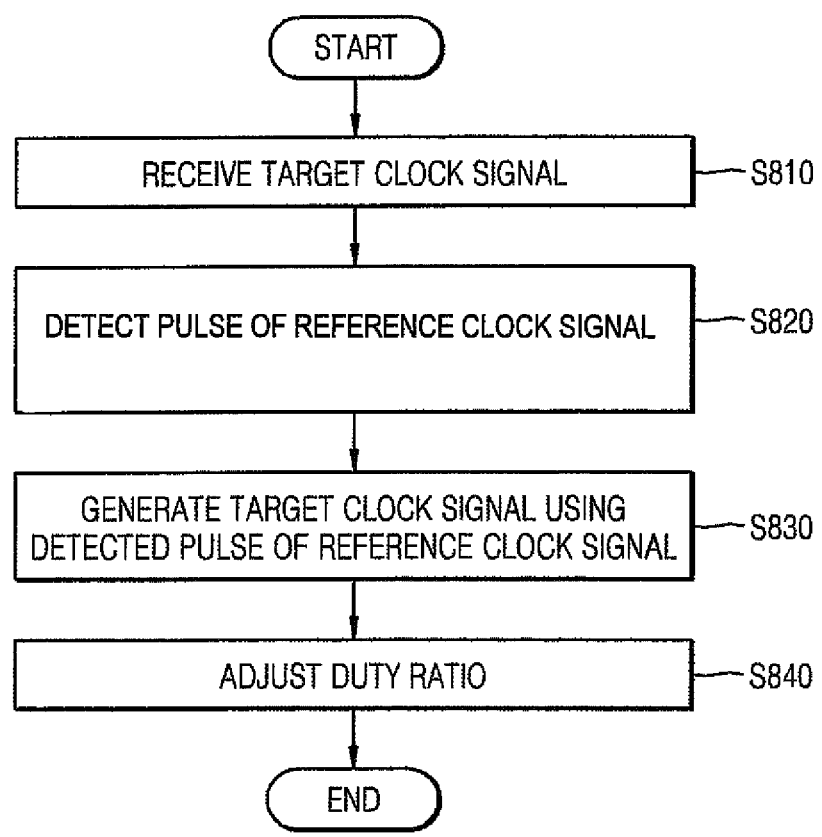
FIG. 8 is a flowchart depicting a method of generating a clock signal according to another embodiment of the present invention.

FIG. 8 is a flowchart illustrating a method of generating a clock signal according to another embodiment of the present invention. To generate a target clock signal, the method illustrated in FIG. 7 involves calculating the pulse detecting position of the reference clock signal. In comparison, the method illustrated in FIG. 8 involves receiving a clock signal for detecting an externally provided pulse, the clock signal corresponding to a frequency of a target clock signal.

Initially, an externally provided clock signal is received (S810). The received clock signal has a frequency which is the same as a target frequency intended to be generated.

Then, a pulse of a reference clock signal is detected using the received clock signal as the clock signal for detecting the pulse (S820). There are several methods to detect the pulse of the reference clock signal using the externally provided clock signal, such as, to detect the pulse closest to a rising edge of the clock signal for detecting the pulse, to detect the pulse generated immediately before the rising edge of the clock signal for detecting the pulse, to detect the pulse generated immediately after the rising edge of the clock signal for detecting the pulse, or to detect the pulse generated a predetermined number of cycles from the rising edge of the clock signal for detecting the pulse. In an exemplary embodiment, the pulse of the reference clock signal is detected in relation to the occurrence of the rising edge of the clock signal for detecting the pulse. Alternatively, the pulse of the reference clock signal may be detected at the occurrence of the falling edge of the clock signal for detecting the pulse.

The final target clock signal is generated using the detected pulse of the reference clock signal (S830). That is, the final target clock signal is generated by discarding some of the pulses of the reference clock signal.

Then, a duty ratio of the target clock signal generated in operation S830 is adjusted (S840). For instance, the duty ratio of the target clock signal may be increased by extending the length of a span of pulses at a logic "high" level in the target clock signal to the reference clock signal's initially set cycle length. In an embodiment, operation S840 is optional, and it can be omitted when an application which processes data using the target clock signal can operate stably with a target clock signal having a low duty ratio.

Accordingly, when the frequency of the target clock signal cannot be generated from the reference clock signal by using a frequency divider, an edge position of a target clock signal externally generated does not match the edge position of the reference clock signal. However, the edge position of the target clock signal generated according to the present method corresponds to the edge position of the reference clock signal, and the target clock signal has uniform clock intervals.

Figure 5:
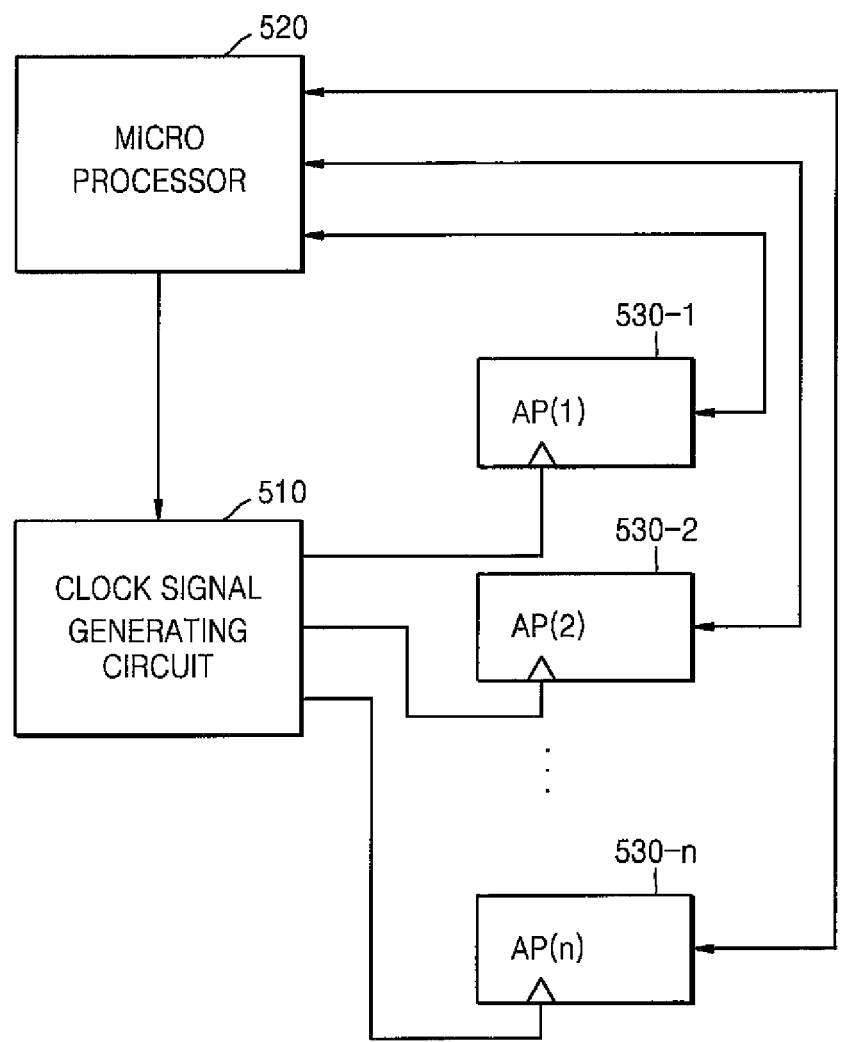
FIG. 5 is a configuration diagram of a device for controlling a clock frequency, according to an embodiment of the present invention.

FIG. 5 is a block diagram depicting a device for controlling a clock frequency according to an embodiment of the present invention. Referring to FIG. 5, the device includes a clock signal generating circuit 510, a microprocessor 520, and a plurality of applications AP(1), AP(2), . . . , AP(n).

The clock signal generating circuit 510 generates clock signals having target frequencies corresponding to each of the applications AP(1), AP(2), . . . , AP(n). In an embodiment, the circuitry structure of the clock signal generating circuit 510 is similar to the structure of the reference clock generator 110, described with respect to FIG. 1, or the reference clock generator 410, described with respect to FIG. 4.

Each of the applications AP(1), AP(2), . . . , AP(n) processes data in response to commands from the microprocessor 520. The applications AP(1), AP(2), . . . , AP(n) may include, for example, a video/audio signal processing application, a data storing and reading application, a data communication processing application, and the like.

The microprocessor 520 controls applications AP(1), AP(2), . . . , AP(n). For example, when issuing commands instructing each of the applications to process a certain operation, the microprocessor 520 may calculate the percentage of progress, which is how much an application has processed its respective operation. The microprocessor 520 may then control the clock signal generating circuit 510 to change a clock frequency of a corresponding application based on the difference between the calculated progress percentage and a target progress percentage associated with the operation being processed by the application. Methods of calculating progress percentages of an operation are well-known, and thus are not specifically described herein.

The microprocessor 520 controls the clock signal generating circuit 510 to decrease the frequency of a clock used by an application when the calculated progress percentage of processing the operation is greater than the target progress percentage, for example, by a predetermined amount. Alternatively, the microprocessor 520 controls the clock signal generating circuit 510 to increase the frequency of the clock when the calculated progress percentage of processing the operation is less than the target progress percentage, for example, by a predetermined amount, which may be the same as the predetermined amount used to determine when to decrease the clock frequency.

As stated above, the circuitry structure of the clock signal generating circuit 510 may be similar to that of the reference clock generators 110 or 410, described with respect to FIG. 1 or FIG. 4, respectively. When the clock signal generating circuit 510 is similar to the reference clock generator 110 illustrated in FIG. 1, the clock frequency may be adjusted by changing a mapping table of the masking pattern generator 120. When the clock signal generating circuit 510 is similar to the reference clock generator 410 illustrated in FIG. 4, the clock frequency may be adjusted by changing a pulse detecting position of the reference clock signal.

Figure 9:
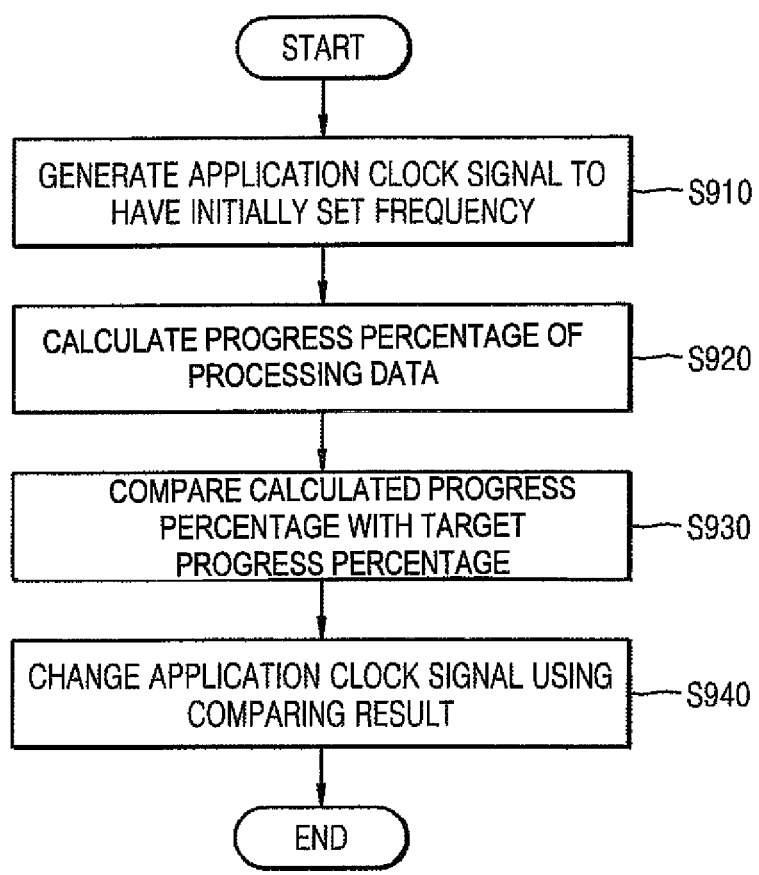
FIG. 9 is a flowchart depicting a method of controlling a clock signal, according to an embodiment of the present invention.

FIG. 9 is a flowchart illustrating a method of controlling a clock frequency, according to an embodiment of the present invention. A clock signal for an application is generated to have an initially set frequency (S910). The clock signal may be generated by discarding some pulses of a reference clock signal acting as the source clock signal. Alternatively, the clock signal may be generated by calculating a pulse detecting position from the reference clock signal which corresponds to the target frequency, and detecting a clock pulse of the reference clock signal having a predetermined relationship with the calculated position, e.g., the clock pulse closest to the calculated position, as discussed above.

A progress percentage is calculated, indicating how much the application has processed data in accordance with a corresponding operation (S920). The progress percentage may be obtained, for example, as a ratio of an amount of an operation which has been currently processed to a total amount of the operation to be processed.

The calculated progress percentage is compared to a target progress percentage (S930). The target progress percentage may be obtained, for example, as a ratio of the target amount of an operation which should have been processed at that point in time to the total amount of the operation to be processed.

The frequency of the clock used by the application may be changed by comparing the results of the calculated progress percentage and the target progress percentage (S940). More particularly, the frequency of the clock used by the corresponding application is decreased when the calculated progress percentage is greater than the target progress percentage, for example, by a predetermined threshold for exceeding the target progress percentage. Likewise, the frequency of the clock is increased when the calculated progress percentage is less than the target progress percentage, for example, by a predetermined threshold for not exceeding the target progress percentage. Accordingly, the clock frequency used by the application may be adaptively adjusted, considering the corresponding progress percentage of processing the data.

As described above, according to various embodiments of the present invention, some clock pulses of a reference clock signal may be discarded or detected to generate a clock signal (generally having a target frequency) from the reference clock signal. Accordingly, the following exemplary results of may be obtained: First, a clock signal having a desired frequency can be generated using a simple circuit. Second, clock signals having frequencies that cannot be generated using a frequency divider can be produced without adding new reference clock signals. Third, an edge position of a derived clock signal is controlled to correspond to an edge position of a reference clock signal, thus eliminating the need for an additional synchronizer. Fourth, an average frequency of a created clock signal matches an average frequency of a target frequency, and the frequency of the created clock signal can be varied locally, thus reducing the effects of EMI. Fifth, a frequency of a target clock signal can be adjusted by changing the number of pulses discarded from a reference clock signal or by changing a clock signal detecting position. Sixth, a frequency of a clock signal used by an application can be adaptively adjusted for optimization, considering an operation processing progress percentage of the application.

Various embodiments of the present invention may include a method, a device, a system and software. When embodied as software, aspects of the present invention are necessarily code segments for performing required operations. A computer program including the code segments may be stored in a processor readable medium and transmitted through computer data signals combined with carrier waves over a transmission medium and/or a communication network. The processor readable medium includes any medium that can store or transmit data. Examples of processor readable media include an electronic circuit, a semiconductor memory device, a ROM, a Flash memory, an erasable ROM (EROM), a floppy disk, an optical disk, a hard disk, an optical fiber medium, a radio frequency (RF) network, etc. Computer data signals include any signals which can be transmitted through a transmission medium, such as an electronic network channel, optical fiber, air, an electromagnetic field, an RF network, etc.

While the present invention has been particularly shown and described with reference to exemplary embodiments thereof, it is not limited thereto. It will be apparent to those of ordinary skill in the art that various changes in form and details may be made therein without departing from the spirit and scope of the present invention.

What is claimed is:

1. A method of controlling a clock frequency, the method comprising:
   generating a clock signal for an application having, on average, a target frequency from a reference clock signal;
   calculating a data processing progress percentage of processing data using the clock signal;
   determining a difference between the calculated data processing progress percentage and a target progress percentage; and
   changing the target frequency of the clock signal based on the determined difference.

2. The method of claim 1, wherein generating the clock signal for the application comprises discarding a calculated number of pulses from each of a plurality of sections of the reference clock signal, so that the reference clock signal comprises, on average, the target frequency.

3. The method of claim 1, wherein generating the clock signal for the application comprises:
   calculating a pulse detecting location in a plurality of cycles of the reference clock signal, a number of pulses of a cycle corresponding to an inverse of the target frequency; and
   detecting a pulse of the reference clock signal closest to the calculated pulse detecting location.

4. The method of claim 1, wherein changing the target frequency of the clock signal comprises:
   decreasing the target frequency of the clock signal when the calculated progress percentage is greater than the target progress percentage by a first predetermined amount; and
   increasing the target frequency of the clock signal when the calculated progress percentage is less than the target progress percentage by a second predetermined amount.

5. A device for controlling a clock frequency, the device comprising:
   a clock signal generating circuit configured to generate a clock signal for an application, the clock signal having a target frequency from a reference clock signal;
   an application circuit configured to process data using the clock signal for the application; and
   a microprocessor configured by software to provide instructions for calculating a data processing progress percentage of the application circuit and for controlling the clock signal generating circuit to change the target frequency based on a difference between the calculated data processing progress percentage and a target progress percentage.

6. The device of claim 5, wherein the clock signal generating circuit comprises:
   a masking pattern generator configured to create a masking pattern to discard at least one pulse from the reference clock signal to obtain the target frequency from the reference clock signal; and
   an AND gate configured to generate the clock signal for the application by logically multiplying the reference clock signal and the masking pattern.

7. The device of claim 5, wherein the clock signal generating circuit comprises:
   an arithmetic circuit configured to calculate a pulse detecting location in a plurality of cycles, each cycle comprising a number of pulses corresponding to an inverse of the target frequency of the clock signal for the application; and
   a pulse detector configured to detect a pulse of the reference clock signal generated closest to the pulse detecting location.

8. The device of claim 5, wherein the microprocessor is further configured by software to provide instructions for controlling the clock signal generating circuit to decrease a frequency of the clock signal when the calculated progress percentage is greater than the target progress percentage by a first predetermined amount, and for increasing the frequency of the clock signal when the calculated progress percentage is less than the target progress percent by a second predetermined amount.

* * * * *